US010516612B2

(12) United States Patent
Dharmapurikar et al.

(10) Patent No.: US 10,516,612 B2
(45) Date of Patent: *Dec. 24, 2019

(54) SYSTEM AND METHOD FOR IDENTIFICATION OF LARGE-DATA FLOWS

(71) Applicant: Cisco Technology, Inc., San Jose, CA (US)

(72) Inventors: Sarang M. Dharmapurikar, Cupertino, CA (US); Mohammadreza Alizadeh Attar, Santa Clara, CA (US); Kit Chiu Chu, Fremont, CA (US); Francisco M. Matus, Saratoga, CA (US); Adam Hutchin, Mountain View, CA (US); Janakiramanan Vaidyanathan, San Ramon, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 64 days.

This patent is subject to a terminal disclaimer.

(21) Appl. No.: 15/792,587

(22) Filed: Oct. 24, 2017

(65) Prior Publication Data

US 2018/0048571 A1 Feb. 15, 2018

Related U.S. Application Data

(63) Continuation of application No. 14/490,596, filed on Sep. 18, 2014, now Pat. No. 9,832,122.

(Continued)

(51) Int. Cl.
*H04L 12/743* (2013.01)
*G11C 15/04* (2006.01)
(Continued)

(52) U.S. Cl.
CPC .......... *H04L 45/7453* (2013.01); *G11C 15/04* (2013.01); *H04L 45/24* (2013.01);
(Continued)

(58) Field of Classification Search
CPC ............................ H04L 45/7453; H04L 49/90
See application file for complete search history.

(56) References Cited

U.S. PATENT DOCUMENTS

| 4,298,770 A | 11/1981 | Nishihara et al. |
| 4,636,919 A | 1/1987 | Itakura et al. |

(Continued)

FOREIGN PATENT DOCUMENTS

| WO | WO 03/067799 | 8/2003 |
| WO | WO 2014/071996 | 5/2014 |

OTHER PUBLICATIONS

Aslam, Faisal, et al., "NPP: A Facility Based Computation Framework for Restoration Routing Using Aggregate Link Usage Information," Proceedings of QoS-IP: quality of service in multiservice IP network, Feb. 2005, pp. 150-163.

(Continued)

*Primary Examiner* — Derrick W Ferris
*Assistant Examiner* — Kevin H Lee
(74) *Attorney, Agent, or Firm* — Polsinelli PC (57) ABSTRACT

Apparatus, systems and methods may be used to monitor data flows and to select and track particularly large data flows. A method of tracking data flows and identifying large-data ("elephant") flows comprises extracting fields from a packet of data to construct a flow key, computing a hash value on the flow key to provide a hashed flow signature, entering and/or comparing the hashed flow signature with entries in a flow hash table. Each hash table entry includes a byte count for a respective flow. When the byte count for a flow exceeds a threshold value, the flow is added to a large-data flow ("elephant") table and the flow is then tracked in the large-data flow table.

17 Claims, 7 Drawing Sheets

Related U.S. Application Data (60) Provisional application No. 61/900,314, filed on Nov. 5, 2013.

(51) Int. Cl.
  *H04L 12/707* (2013.01)
  *H04L 12/803* (2013.01)
  *G11C 11/4096* (2006.01)
  *G06K 15/10* (2006.01)
  *G06F 9/30* (2018.01)
  *G11C 15/00* (2006.01)

(52) U.S. Cl.
  CPC ........ *H04L 47/125* (2013.01); *G06F 9/30018* (2013.01); *G06K 15/107* (2013.01); *G11C 11/4096* (2013.01); *G11C 15/00* (2013.01); *G11C 2207/002* (2013.01)

(56) References Cited

U.S. PATENT DOCUMENTS

| | | | |
|---|---|---|---|
| 4,700,016 A | 10/1987 | Hitchcock et al. |
| 5,115,431 A | 5/1992 | Williams et al. |
| 5,859,835 A | 1/1999 | Varma et al. |
| 5,926,458 A | 7/1999 | Yin et al. |
| 6,252,876 B1 | 6/2001 | Brueckheimer et al. |
| 6,389,031 B1 | 5/2002 | Chao et al. |
| 6,456,624 B1 | 9/2002 | Eccles et al. |
| 6,650,640 B1 | 11/2003 | Muller |
| 6,677,831 B1 | 1/2004 | Cheng et al. |
| 6,714,553 B1 | 3/2004 | Poole et al. |
| 6,757,897 B1 | 6/2004 | Shi et al. |
| 6,876,952 B1 | 4/2005 | Kappler et al. |
| 6,907,039 B2 | 6/2005 | Shen |
| 6,941,649 B2 | 9/2005 | Goergen |
| 6,952,421 B1 | 10/2005 | Slater |
| 6,954,463 B1 | 10/2005 | Ma et al. |
| 6,996,099 B1 | 2/2006 | Kadambi et al. |
| 7,068,667 B2 | 6/2006 | Foster et al. |
| 7,152,117 B1 | 12/2006 | Stapp et al. |
| 7,177,946 B1 | 2/2007 | Kaluve et al. |
| 7,372,857 B1 | 5/2008 | Kappler et al. |
| 7,411,915 B1 | 8/2008 | Spain et al. |
| 7,426,604 B1 | 9/2008 | Rygh et al. |
| 7,516,211 B1 | 4/2009 | Gourlay et al. |
| 7,539,131 B2 | 5/2009 | Shen |
| 7,580,409 B1 | 8/2009 | Swenson et al. |
| 7,630,368 B2 | 12/2009 | Tripathi et al. |
| 7,729,296 B1 | 6/2010 | Choudhary |
| 7,826,400 B2 | 11/2010 | Sakauchi |
| 7,826,469 B1 | 11/2010 | Li et al. |
| 7,848,340 B2 | 12/2010 | Sakauchi et al. |
| 8,233,384 B2 | 7/2012 | Osterhout et al. |
| 8,302,301 B2 | 11/2012 | Lau |
| 8,325,459 B2 | 12/2012 | Mutnury et al. |
| 8,339,973 B1 | 12/2012 | Pichumani et al. |
| 8,378,223 B1 | 2/2013 | Shiue et al. |
| 8,442,063 B1 | 5/2013 | Zhou et al. |
| 8,514,712 B1 | 8/2013 | Aswadhati |
| 8,687,629 B1 | 4/2014 | Kompella et al. |
| 8,854,972 B1 | 10/2014 | Li |
| 8,868,766 B1 | 10/2014 | Theimer et al. |
| 8,908,691 B2 | 12/2014 | Biswas et al. |
| 9,036,481 B1 | 5/2015 | White |
| 9,106,508 B2 | 8/2015 | Banavalikar et al. |
| 9,178,715 B2 | 11/2015 | Jain et al. |
| 9,197,551 B2 | 11/2015 | DeCusatis et al. |
| 9,203,188 B1 | 12/2015 | Siechen et al. |
| 9,245,626 B2 | 1/2016 | Fingerhut et al. |
| 9,258,195 B1 | 2/2016 | Pendleton et al. |
| 9,325,524 B2 | 4/2016 | Banavalikar et al. |
| 9,374,294 B1 | 6/2016 | Pani |
| 9,402,470 B2 | 8/2016 | Shen et al. |
| 9,407,501 B2 | 8/2016 | Yadav et al. |
| 9,426,060 B2 | 8/2016 | Dixon et al. |
| 9,433,081 B1 | 8/2016 | Xiong et al. |
| 9,444,634 B2 | 9/2016 | Pani |
| 9,502,111 B2 | 11/2016 | Dharmapurikar et al. |
| 9,509,092 B2 | 11/2016 | Shen et al. |
| 9,544,185 B1 | 1/2017 | Yadav et al. |
| 9,544,224 B2 | 1/2017 | Chu et al. |
| 9,590,914 B2 | 3/2017 | Attar et al. |
| 9,627,063 B2 | 4/2017 | Dharmapurikar et al. |
| 9,634,846 B2 | 4/2017 | Pani |
| 9,635,937 B2 | 5/2017 | Shen et al. |
| 9,654,300 B2 | 5/2017 | Pani |
| 9,654,385 B2 | 5/2017 | Chu et al. |
| 9,654,409 B2 | 5/2017 | Yadav et al. |
| 9,655,232 B2 | 5/2017 | Saxena et al. |
| 9,667,431 B2 | 5/2017 | Pani |
| 9,667,551 B2 | 5/2017 | Edsall et al. |
| 9,674,086 B2 | 6/2017 | Ma et al. |
| 9,686,180 B2 | 6/2017 | Chu et al. |
| 9,698,994 B2 | 7/2017 | Pani |
| 9,716,665 B2 | 7/2017 | Attar et al. |
| 9,742,673 B2 | 8/2017 | Banerjee et al. |
| 9,755,965 B1 | 9/2017 | Yadav et al. |
| 9,769,078 B2 | 9/2017 | Attar et al. |
| 9,832,122 B2 | 11/2017 | Dharmapurikar et al. |
| 9,876,715 B2 | 1/2018 | Edsall et al. |
| 2002/0126671 A1 | 9/2002 | Ellis et al. |
| 2002/0136268 A1 | 9/2002 | Gan et al. |
| 2002/0146026 A1 | 10/2002 | Unitt et al. |
| 2003/0035385 A1 | 2/2003 | Walsh et al. |
| 2003/0058837 A1 | 3/2003 | Denney et al. |
| 2003/0058860 A1 | 3/2003 | Kunze et al. |
| 2003/0067912 A1 | 4/2003 | Mead et al. |
| 2003/0067924 A1 | 4/2003 | Choe et al. |
| 2003/0097461 A1 | 5/2003 | Barham et al. |
| 2003/0115319 A1 | 6/2003 | Dawson et al. |
| 2003/0120884 A1 | 6/2003 | Koob et al. |
| 2003/0137940 A1 | 7/2003 | Schwartz et al. |
| 2003/0142629 A1 | 7/2003 | Krishnamurthi et al. |
| 2003/0174650 A1 | 9/2003 | Shankar et al. |
| 2003/0223376 A1 | 12/2003 | Elliott et al. |
| 2003/0231646 A1 | 12/2003 | Chandra et al. |
| 2004/0031030 A1 | 2/2004 | Kidder et al. |
| 2004/0062259 A1 | 4/2004 | Jeffries et al. |
| 2004/0073715 A1 | 4/2004 | Folkes et al. |
| 2004/0100901 A1 | 5/2004 | Bellows |
| 2004/0103310 A1 | 5/2004 | Sobel et al. |
| 2004/0111507 A1 | 6/2004 | Villado et al. |
| 2004/0160956 A1 | 8/2004 | Hardy et al. |
| 2004/0249960 A1 | 12/2004 | Hardy et al. |
| 2005/0007961 A1 | 1/2005 | Scott et al. |
| 2005/0010685 A1 | 1/2005 | Ramnath et al. |
| 2005/0013280 A1 | 1/2005 | Buddhikot et al. |
| 2005/0073958 A1 | 4/2005 | Atlas et al. |
| 2005/0083835 A1 | 4/2005 | Prairie et al. |
| 2005/0091239 A1 | 4/2005 | Ward et al. |
| 2005/0117593 A1 | 6/2005 | Shand |
| 2005/0175020 A1 | 8/2005 | Park et al. |
| 2005/0201375 A1 | 9/2005 | Komatsu et al. |
| 2005/0207410 A1 | 9/2005 | Adhikari et al. |
| 2005/0213504 A1 | 9/2005 | Enomoto et al. |
| 2005/0232227 A1 | 10/2005 | Jorgenson et al. |
| 2005/0240745 A1 | 10/2005 | Iyer et al. |
| 2006/0013143 A1 | 1/2006 | Yasuie et al. |
| 2006/0028285 A1 | 2/2006 | Jang et al. |
| 2006/0031643 A1 | 2/2006 | Figueira |
| 2006/0039364 A1 | 2/2006 | Wright |
| 2006/0072461 A1 | 4/2006 | Luong et al. |
| 2006/0075093 A1 | 4/2006 | Frattura et al. |
| 2006/0083179 A1 | 4/2006 | Mitchell |
| 2006/0083256 A1 | 4/2006 | Mitchell |
| 2006/0182036 A1 | 8/2006 | Sasagawa et al. |
| 2006/0193332 A1 | 8/2006 | Qian et al. |
| 2006/0198315 A1 | 9/2006 | Sasagawa et al. |
| 2006/0209688 A1 | 9/2006 | Tsuge et al. |
| 2006/0209702 A1 | 9/2006 | Schmitt et al. |
| 2006/0215572 A1 | 9/2006 | Padhye et al. |
| 2006/0215623 A1 | 9/2006 | Lin et al. |
| 2006/0221835 A1 | 10/2006 | Sweeney |
| 2006/0221950 A1 | 10/2006 | Heer |

(56) References Cited

U.S. PATENT DOCUMENTS

| | | |
|---|---|---|
| 2006/0227790 A1 | 10/2006 | Yeung et al. |
| 2006/0239204 A1 | 10/2006 | Bordonaro et al. |
| 2006/0250982 A1 | 11/2006 | Yuan et al. |
| 2006/0268742 A1 | 11/2006 | Chu et al. |
| 2006/0274647 A1 | 12/2006 | Wang et al. |
| 2006/0274657 A1 | 12/2006 | Olgaard et al. |
| 2006/0280179 A1 | 12/2006 | Meier |
| 2006/0285500 A1 | 12/2006 | Booth, III et al. |
| 2007/0016590 A1 | 1/2007 | Appleby et al. |
| 2007/0025241 A1 | 2/2007 | Nadeau et al. |
| 2007/0047463 A1 | 3/2007 | Jarvis et al. |
| 2007/0053303 A1 | 3/2007 | Kryuchkov |
| 2007/0058557 A1 | 3/2007 | Cuffaro et al. |
| 2007/0061451 A1 | 3/2007 | Villado et al. |
| 2007/0076605 A1 | 4/2007 | Cidon et al. |
| 2007/0091795 A1 | 4/2007 | Bonaventure et al. |
| 2007/0097872 A1 | 5/2007 | Chiu |
| 2007/0159987 A1 | 7/2007 | Khan et al. |
| 2007/0160073 A1 | 7/2007 | Toumura et al. |
| 2007/0165515 A1 | 7/2007 | Vasseur |
| 2007/0171814 A1 | 7/2007 | Florit et al. |
| 2007/0177525 A1 | 8/2007 | Wijnands et al. |
| 2007/0183337 A1 | 8/2007 | Cashman et al. |
| 2007/0211625 A1 | 9/2007 | Liu et al. |
| 2007/0217415 A1 | 9/2007 | Wijnands et al. |
| 2007/0223372 A1 | 9/2007 | Haalen et al. |
| 2007/0233847 A1 | 10/2007 | Aldereguia et al. |
| 2007/0258382 A1 | 11/2007 | Foll et al. |
| 2007/0258383 A1 | 11/2007 | Wada |
| 2007/0274229 A1 | 11/2007 | Scholl et al. |
| 2007/0280264 A1 | 12/2007 | Milton et al. |
| 2008/0031130 A1 | 2/2008 | Raj et al. |
| 2008/0031146 A1 | 2/2008 | Kwak et al. |
| 2008/0031247 A1 | 2/2008 | Tahara et al. |
| 2008/0092213 A1 | 4/2008 | Wei et al. |
| 2008/0123559 A1 | 5/2008 | Haviv et al. |
| 2008/0147830 A1 | 6/2008 | Ridgill et al. |
| 2008/0151863 A1 | 6/2008 | Lawrence et al. |
| 2008/0177896 A1 | 7/2008 | Quinn et al. |
| 2008/0212496 A1 | 9/2008 | Zou |
| 2008/0219173 A1 | 9/2008 | Yoshida et al. |
| 2008/0225853 A1 | 9/2008 | Melman et al. |
| 2008/0259809 A1 | 10/2008 | Stephan et al. |
| 2008/0259925 A1 | 10/2008 | Droms et al. |
| 2008/0310421 A1 | 12/2008 | Teisberg et al. |
| 2009/0052332 A1 | 2/2009 | Fukuyama et al. |
| 2009/0067322 A1 | 3/2009 | Shand et al. |
| 2009/0094357 A1 | 4/2009 | Keohane et al. |
| 2009/0103566 A1 | 4/2009 | Kloth et al. |
| 2009/0116402 A1 | 5/2009 | Yamasaki |
| 2009/0122805 A1 | 5/2009 | Epps et al. |
| 2009/0161567 A1 | 6/2009 | Jayawardena et al. |
| 2009/0188711 A1 | 7/2009 | Ahmad |
| 2009/0193103 A1 | 7/2009 | Small et al. |
| 2009/0225671 A1 | 9/2009 | Arbel et al. |
| 2009/0232011 A1 | 9/2009 | Li et al. |
| 2009/0238196 A1 | 9/2009 | Ukita et al. |
| 2009/0268614 A1 | 10/2009 | Tay et al. |
| 2009/0271508 A1 | 10/2009 | Sommers et al. |
| 2010/0020719 A1 | 1/2010 | Chu et al. |
| 2010/0020726 A1 | 1/2010 | Chu et al. |
| 2010/0128619 A1 | 5/2010 | Shigei |
| 2010/0150155 A1 | 6/2010 | Napierala |
| 2010/0161787 A1 | 6/2010 | Jones |
| 2010/0189080 A1 | 7/2010 | Hu et al. |
| 2010/0191813 A1 | 7/2010 | Gandhewar et al. |
| 2010/0191839 A1 | 7/2010 | Gandhewar et al. |
| 2010/0223655 A1 | 9/2010 | Zheng |
| 2010/0260197 A1 | 10/2010 | Martin et al. |
| 2010/0287227 A1 | 11/2010 | Goel et al. |
| 2010/0299553 A1 | 11/2010 | Cen |
| 2010/0312875 A1 | 12/2010 | Wilerson et al. |
| 2011/0022725 A1 | 1/2011 | Farkas |
| 2011/0110241 A1 | 5/2011 | Atkinson et al. |
| 2011/0110587 A1 | 5/2011 | Banner |
| 2011/0138310 A1 | 6/2011 | Gomez et al. |
| 2011/0158248 A1 | 6/2011 | Vorunganti et al. |
| 2011/0170426 A1 | 7/2011 | Kompella et al. |
| 2011/0199891 A1 | 8/2011 | Chen |
| 2011/0199941 A1 | 8/2011 | Ouellette et al. |
| 2011/0203834 A1 | 8/2011 | Yoneya et al. |
| 2011/0228795 A1 | 9/2011 | Agrawal et al. |
| 2011/0239189 A1 | 9/2011 | Attalla |
| 2011/0243136 A1 | 10/2011 | Raman et al. |
| 2011/0249682 A1 | 10/2011 | Kean et al. |
| 2011/0268118 A1 | 11/2011 | Schlansker et al. |
| 2011/0273987 A1 | 11/2011 | Schlansker et al. |
| 2011/0280572 A1 | 11/2011 | Vobbilisetty et al. |
| 2011/0286447 A1 | 11/2011 | Liu |
| 2011/0299406 A1 | 12/2011 | Vobbilisetty et al. |
| 2011/0310738 A1 | 12/2011 | Lee et al. |
| 2011/0321031 A1 | 12/2011 | Dournov et al. |
| 2012/0007688 A1 | 1/2012 | Zhou et al. |
| 2012/0030150 A1 | 2/2012 | McAuley et al. |
| 2012/0030666 A1 | 2/2012 | Laicher et al. |
| 2012/0057505 A1 | 3/2012 | Xue |
| 2012/0063318 A1 | 3/2012 | Boddu et al. |
| 2012/0102114 A1 | 4/2012 | Dunn et al. |
| 2012/0147752 A1 | 6/2012 | Ashwood-Smith et al. |
| 2012/0163396 A1 | 6/2012 | Cheng et al. |
| 2012/0167013 A1 | 6/2012 | Kaiser et al. |
| 2012/0195233 A1 | 8/2012 | Wang et al. |
| 2012/0275304 A1 | 11/2012 | Patel et al. |
| 2012/0281697 A1 | 11/2012 | Huang |
| 2012/0300669 A1 | 11/2012 | Zahavi |
| 2012/0300787 A1 | 11/2012 | Korger |
| 2012/0314581 A1 | 12/2012 | Rajamanickam et al. |
| 2013/0055155 A1 | 2/2013 | Wong et al. |
| 2013/0064246 A1 | 3/2013 | Dharmapurikar et al. |
| 2013/0090014 A1 | 4/2013 | Champion |
| 2013/0097335 A1 | 4/2013 | Jiang et al. |
| 2013/0124708 A1 | 5/2013 | Lee et al. |
| 2013/0151681 A1 | 6/2013 | Dournov et al. |
| 2013/0182712 A1 | 7/2013 | Aguayo et al. |
| 2013/0208624 A1 | 8/2013 | Ashwood-Smith |
| 2013/0223276 A1 | 8/2013 | Padgett |
| 2013/0227108 A1 | 8/2013 | Dunbar et al. |
| 2013/0227689 A1 | 8/2013 | Pietrowicz et al. |
| 2013/0250779 A1 | 9/2013 | Meloche et al. |
| 2013/0250951 A1 | 9/2013 | Koganti |
| 2013/0276129 A1 | 10/2013 | Nelson et al. |
| 2013/0311663 A1 | 11/2013 | Kamath et al. |
| 2013/0311991 A1 | 11/2013 | Li et al. |
| 2013/0322258 A1 | 12/2013 | Nedeltchev et al. |
| 2013/0322446 A1 | 12/2013 | Biswas et al. |
| 2013/0322453 A1 | 12/2013 | Allan |
| 2013/0329605 A1 | 12/2013 | Nakil et al. |
| 2013/0332399 A1 | 12/2013 | Reddy et al. |
| 2013/0332577 A1 | 12/2013 | Nakil et al. |
| 2013/0332602 A1 | 12/2013 | Nakil et al. |
| 2014/0006549 A1 | 1/2014 | Narayanaswamy et al. |
| 2014/0016501 A1 | 1/2014 | Kamath et al. |
| 2014/0043535 A1 | 2/2014 | Motoyama et al. |
| 2014/0043972 A1 | 2/2014 | Li et al. |
| 2014/0047264 A1 | 2/2014 | Wang et al. |
| 2014/0050223 A1 | 2/2014 | Foo et al. |
| 2014/0056298 A1 | 2/2014 | Vobbilisetty et al. |
| 2014/0064281 A1 | 3/2014 | Basso et al. |
| 2014/0068750 A1 | 3/2014 | Tjahjono et al. |
| 2014/0086097 A1 | 3/2014 | Qu et al. |
| 2014/0086253 A1 | 3/2014 | Yong et al. |
| 2014/0105039 A1 | 4/2014 | Mcdysan |
| 2014/0105062 A1 | 4/2014 | Mcdysan et al. |
| 2014/0105216 A1 | 4/2014 | Mcdysan |
| 2014/0108489 A1 | 4/2014 | Glines et al. |
| 2014/0122791 A1 | 5/2014 | Fingerhut et al. |
| 2014/0146817 A1 | 5/2014 | Zhang |
| 2014/0146824 A1 | 5/2014 | Angst et al. |
| 2014/0149819 A1 | 5/2014 | Lu et al. |
| 2014/0185348 A1 | 7/2014 | Vattikonda et al. |
| 2014/0185349 A1 | 7/2014 | Terzioglu et al. |
| 2014/0201375 A1 | 7/2014 | Beereddy et al. |
| 2014/0219275 A1 | 8/2014 | Allan et al. |
| 2014/0241353 A1 | 8/2014 | Zhang et al. |

(56) References Cited

U.S. PATENT DOCUMENTS

| | | |
|---|---|---|
| 2014/0244779 A1 | 8/2014 | Roitshtein et al. |
| 2014/0269705 A1 | 9/2014 | DeCusatis et al. |
| 2014/0269712 A1 | 9/2014 | Kidambi |
| 2014/0307744 A1 | 10/2014 | Dunbar et al. |
| 2014/0321277 A1 | 10/2014 | Lynn, Jr. et al. |
| 2014/0328206 A1 | 11/2014 | Chan et al. |
| 2014/0334295 A1 | 11/2014 | Guichard et al. |
| 2014/0341029 A1 | 11/2014 | Allan et al. |
| 2014/0372582 A1 | 12/2014 | Ghanwani et al. |
| 2015/0009992 A1 | 1/2015 | Zhang |
| 2015/0010001 A1 | 1/2015 | Duda et al. |
| 2015/0016277 A1 | 1/2015 | Smith et al. |
| 2015/0052298 A1 | 2/2015 | Brand et al. |
| 2015/0092551 A1 | 4/2015 | Moisand et al. |
| 2015/0092593 A1 | 4/2015 | Kompella |
| 2015/0113143 A1 | 4/2015 | Stuart et al. |
| 2015/0124629 A1 | 5/2015 | Pani |
| 2015/0124631 A1 | 5/2015 | Edsall et al. |
| 2015/0124633 A1 | 5/2015 | Banerjee et al. |
| 2015/0124640 A1 | 5/2015 | Chu et al. |
| 2015/0124644 A1 | 5/2015 | Pani |
| 2015/0124652 A1 | 5/2015 | Dharmapurikar et al. |
| 2015/0124806 A1 | 5/2015 | Banerjee et al. |
| 2015/0124817 A1 | 5/2015 | Merchant et al. |
| 2015/0124821 A1 | 5/2015 | Chu et al. |
| 2015/0124823 A1 | 5/2015 | Pani et al. |
| 2015/0124824 A1 | 5/2015 | Edsall et al. |
| 2015/0124833 A1 | 5/2015 | Ma et al. |
| 2015/0127797 A1 | 5/2015 | Attar et al. |
| 2015/0127900 A1 | 5/2015 | Dharmapurikar et al. |
| 2015/0188771 A1 | 7/2015 | Allan et al. |
| 2015/0236900 A1 | 8/2015 | Chung |
| 2015/0378712 A1 | 12/2015 | Cameron et al. |
| 2015/0378969 A1 | 12/2015 | Powell et al. |
| 2016/0036697 A1 | 2/2016 | DeCusatis et al. |
| 2016/0119204 A1 | 4/2016 | Murasato et al. |
| 2016/0315811 A1 | 10/2016 | Yadav et al. |
| 2017/0085469 A1 | 3/2017 | Chu et al. |
| 2017/0207961 A1 | 7/2017 | Saxena et al. |
| 2017/0214619 A1 | 7/2017 | Chu et al. |
| 2017/0237651 A1 | 8/2017 | Pani |
| 2017/0237678 A1 | 8/2017 | Ma et al. |
| 2017/0250912 A1 | 8/2017 | Chu et al. |
| 2017/0346748 A1 | 11/2017 | Attar et al. |

OTHER PUBLICATIONS

Chandy, K. Mani, et al., "Distribution Snapshots: Determining Global States of Distributed Systems," ACM Transaction on Computer Systems, Feb. 1985, vol. 3, No. 1, pp. 63-75.

Khasnabish, Bhumip, et al., "Mobility and Interconnection of Virtual Machines and Virtual Network Elements; draft-khasnabish-vmmi-problems-03.txt," Network Working Group, Dec. 30, 2012, pp. 1-29.

Kodialam, Murali, et. al, "Dynamic Routing of Locally Restorable Bandwidth Guaranteed Tunnels using Aggregated Link Usage Information," Proceedings of IEEE INFOCOM, 2001, vol. 1, pp. 376-385.

Li, Li, et. al, "Routing Bandwidth Guaranteed Paths with Local Restoration in Label Switched Networks," IEEE Journal on Selected Areas in Communications, Feb. 7, 2005, vol. 23, No. 2, pp. 1-11.

Mahalingam, M., et al. "VXLAN: A Framework for Overlaying Virtualized Layer 2 Networks over Layer 3 Networks," VXLAN, Internet Engineering Task Force, Internet Draft, located at https://tools.ietf._org/html/draft-mahalingam-dutt-dcops-vxlan-06, Oct. 2013, pp. 1-24.

Moncaster, T., et al., "The Need for Congestion Exposure in the Internet", Oct. 26, 2009, Internet-Draft, pp. 1-22.

Narten, T., et al., "Problem Statement: Overlays for Network Virtualization," draft-ietf-nvo3-overlay-problem-statement-04, Internet Engineering Task Force, Jul. 31, 2013, pp. 1-24.

Pan, P., et. al, "Fast Reroute Extensions to RSVP-TE for LSP Tunnels," RFC-4090. May 2005, pp. 1-38.

Raza, Saqib, et al., "Online Routing of Bandwidth Guaranteed Paths with Local Restoration using Optimized Aggregate Usage Information," IEEE-ICC '05 Communications, May 2005, vol. 1, 8 pages.

Sinha, Shan, et al., "Harnessing TCP's Burstiness with Flowlet Switching," Nov. 2004, 6 pages.

Zhang et al., "Optimizing Network Performance using Weighted Multipath Routing," Aug. 27, 2012, 7 pages.

Author Unknown, "Subset—Wikipedia, the free encyclopedia," Dec. 25, 2014, pp. 1-3.

Whitaker et al., "Forwarding Without Loops in Icarus," IEEE OPENARCH 2002, pp. 63-75.

SYSTEM AND METHOD FOR IDENTIFICATION OF LARGE-DATA FLOWS

CROSS REFERENCE TO RELATED APPLICATION

This application is a continuation of U.S. patent application Ser. No. 14/490,596, filed Sep. 18, 2014, which claims priority to U.S. Provisional Patent Application No. 61/900,314, filed Nov. 5, 2013, the contents of which are incorporated herein by reference in their entireties.

TECHNICAL FIELD

Aspects of the present technology pertains to detection of large-volume data flows, and more specifically pertains to detection of large-volume data flows in a network device.

BACKGROUND

In a network device, such as a router or a switch, a small number of connections (aka "flows") between two hosts may typically consume large amounts of bandwidth, and it may be desirable to identify and analyze such flows, which are sometimes called "elephant flows." Such analysis may be useful, e.g., for analytics and/or load-balancing.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

A method of tracking data flows and identifying large-data ("elephant") flows comprises extracting fields from a packet of data to construct a flow key, computing a hash value on the flow key to provide a hashed flow signature, entering and/or comparing the hashed flow signature with entries in a flow hash table. Each hash table entry includes a byte count for a respective flow. When the byte count for a flow exceeds a threshold value, the flow is added to a large-data flow (elephant) table and the flow is then tracked in the large-data flow table.

Description

As used herein, the term "network device" refers generally to components used to connect computers or other electronic devices together so they can share files or resources. Examples of network devices include routers, switches and hubs. A "network host" or "host" as used herein refers to a computer or other device connected to a computer network that may offer resources, services and applications to users or other nodes on the network. A network host is a network node that is assigned a network layer host address. Computers participating in networks that use the Internet Protocol Suite may be called IP hosts, and have one or more IP addresses assigned to their network interfaces. A routing table or more generally "table" as used herein refers to a table used by network devices to generate and/or analyze destinations of packets of data. A routing table is utilized by network routers to evaluate the destinations of the data packets to be forwarded. It can, for example, be a small in-memory database controlled by the router's built-in software and hardware that contains the necessary data to forward a packet to its destination. Each packet transmitted across a network generally contains information about its origin (aka "source") and its destination. A routing table is used by all IP-enabled devices, like routers and switches, and can include, for example, the destination IP address, the source IP address, the destination port and the source port.

As used herein, the term "flow" refers generally to one or more packets of data that travel from a source computer ("host") to a destination, which may be another host. A flow is a sequence of packets sent from a particular source to a particular destination, and may be observed as a set of IP packets passing an observation point (such as a network device) in the network during a certain time interval. A "packet" as used herein refers to a formatted unit carried by a network, such as a packet-switched network. A packet generally consists of two types of data, including control (or "header") information and user information (sometimes called "payload"). The control information provides the network with the appropriate data in order to deliver the user data to the appropriate destination. The user data in an example embodiment is data carried on behalf of an application, and is usually of variable length.

A "hash table" as used herein refers generally to a data structure that uses a hash function to implement an associative array, a structure that can map keys to values. For example, the hash table can implement a hash function to compute an index into an array of "buckets" or "slots", from which a select value, associated with a key (identifier) can be found. It should also be understood that, although hash tables are shown and described in some exemplary embodiments, other tables and data structures having functionalities and features in accordance with the disclosures herein, can be employed in accordance with ordinary skill.

Figure 1:
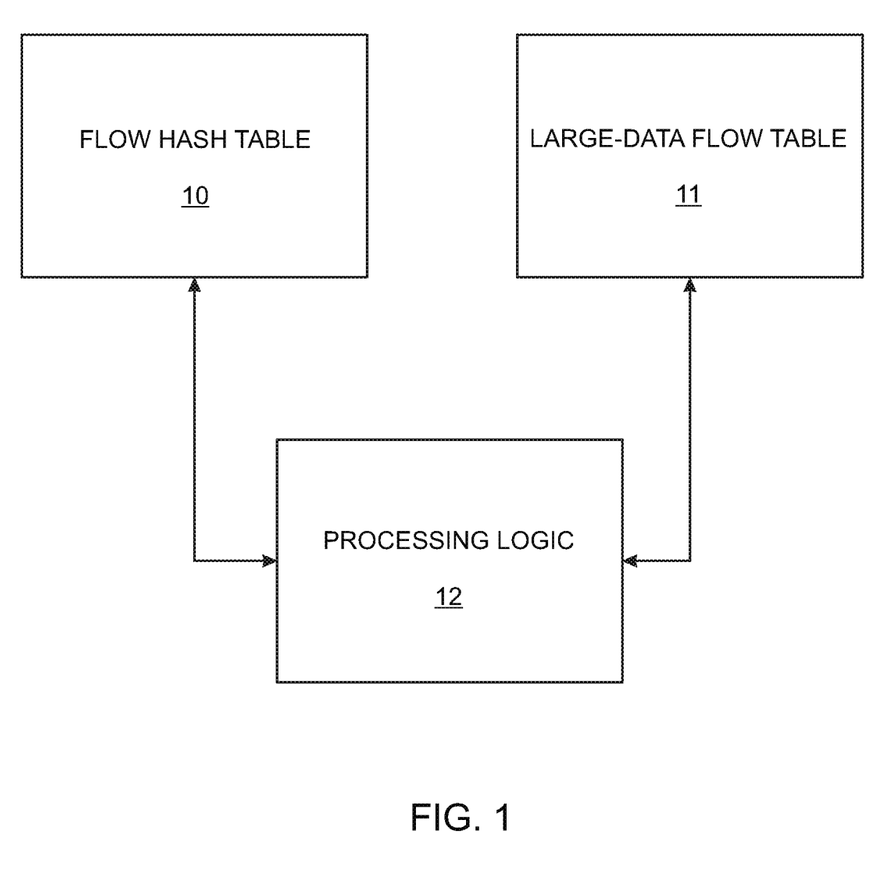
FIG. 1 illustrates an example embodiment of an aspect of the present disclosure.
Figure 2:
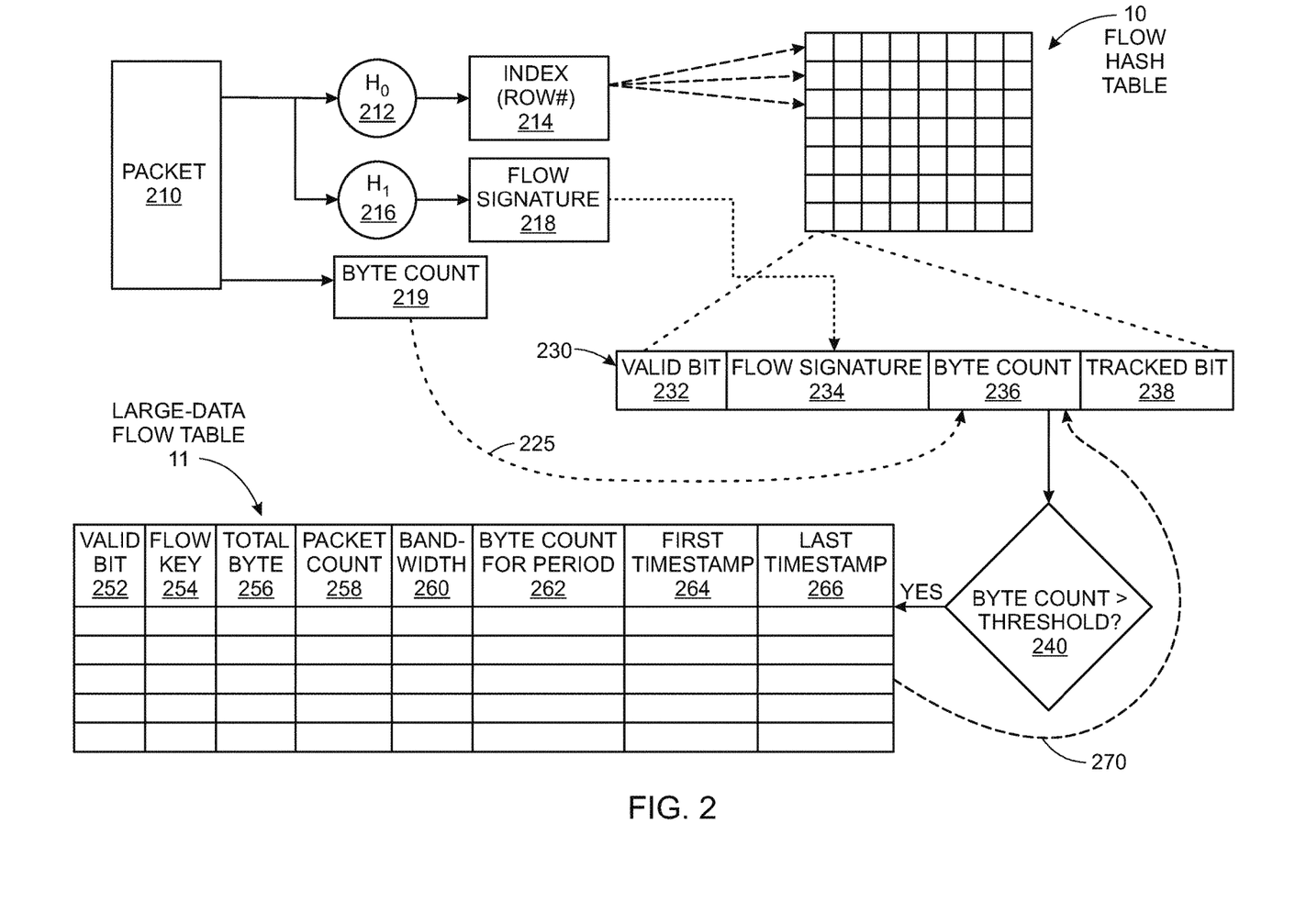
FIG. 2 illustrates an example embodiment of an overall system flow.
Figure 3:
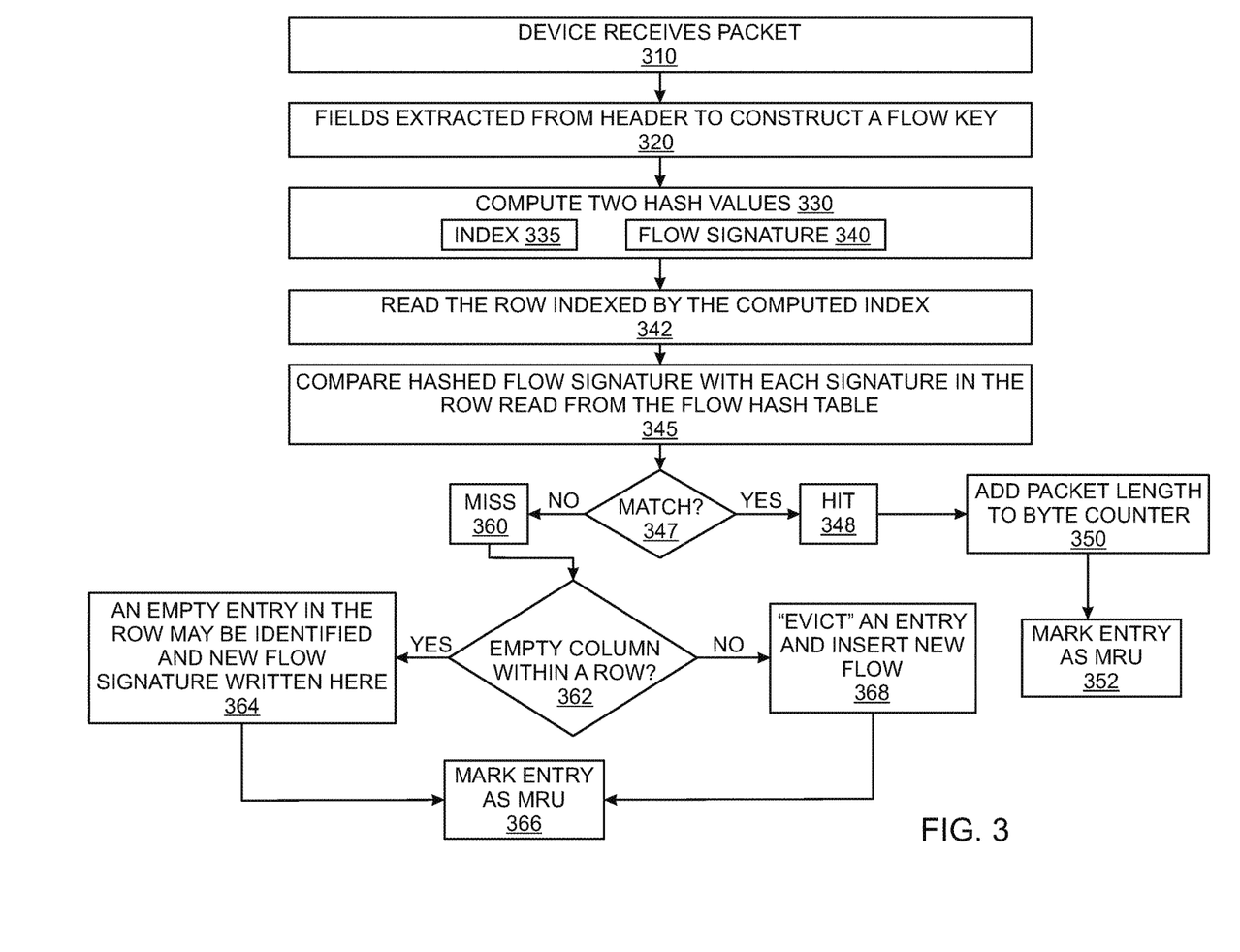
FIG. 3 illustrates an example embodiment of a method for identifying large-data flows.
Figure 4:
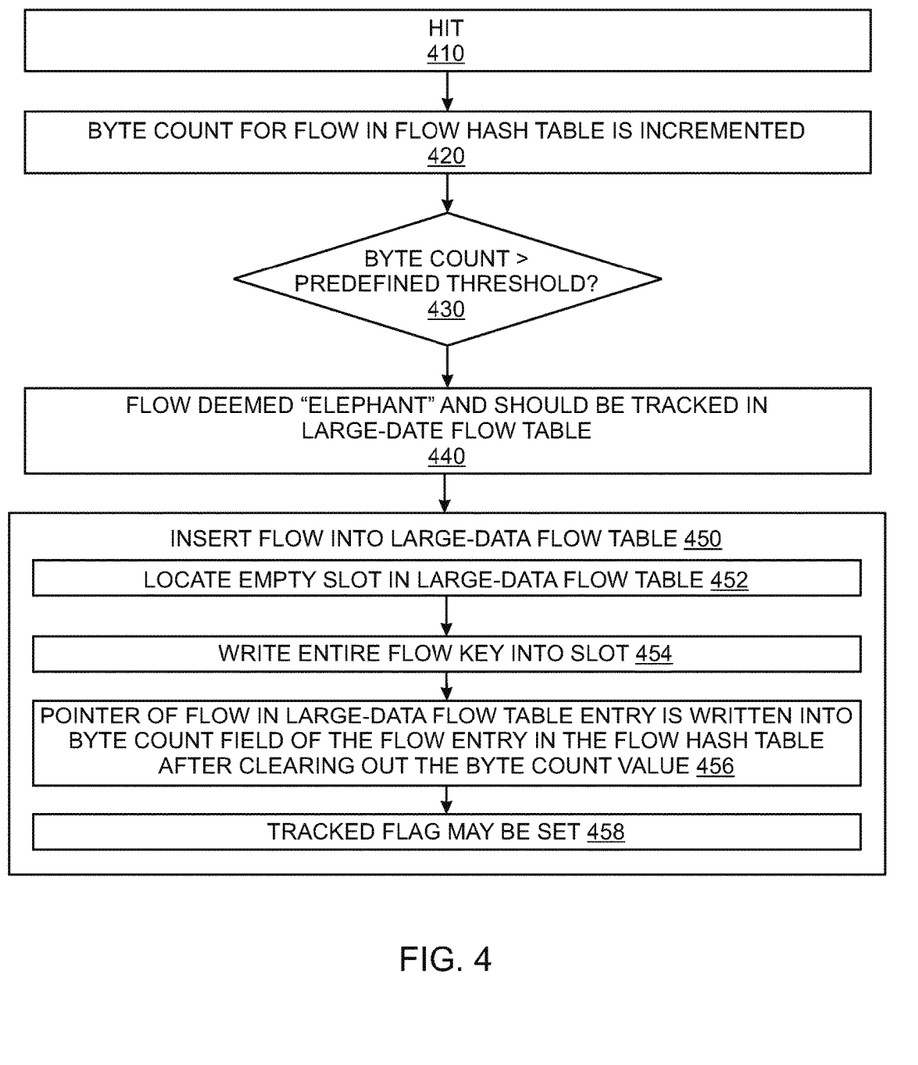
FIG. 4 illustrates an example embodiment of a method for adding large-data flows into a large-data flow "elephant" table.
Figure 5:
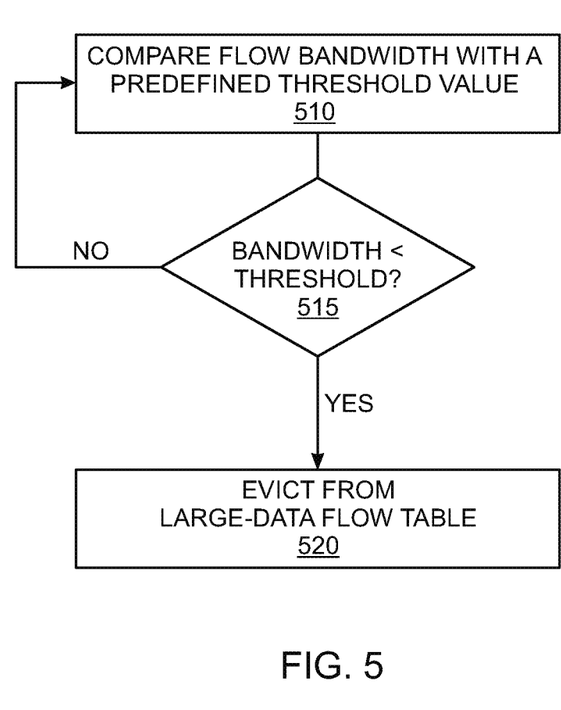
FIG. 5 illustrates an example embodiment of a method for evicting large-data (elephant) flows from the large-data flow (elephant flow) table.

The disclosed technology addresses the need in the art for techniques and systems that may be used for identifying relatively large (elephant) flows from among mixed flows (a plurality of relatively large and relatively small flows, i.e., elephants and mice) in an efficient fashion. Disclosed are systems, methods, machines, and computer-readable storage media for identifying and tracking large-data flows. An aspect of the present disclosure is shown in FIG. 1, an example embodiment of overall system flow is shown in FIG. 2, an example embodiment of flow for identifying large-data flows is shown in FIG. 3, an example embodiment of flow for adding large-data (elephant) flows to a large-flow (elephant) table is shown in FIG. 4, and an example embodiment for evicting elephant flows from the large-data (elephant) flow table is shown in FIG. 5. A brief description of exemplary systems and networks, as illustrated in FIGS. 1 and 4, is disclosed herein. These embodiments and related variations shall be described herein as the various embodiments are set forth. The disclosure now turns to FIG. 1.

FIG. 1 illustrates a conceptual block diagram of an aspect of the disclosed subject matter. An apparatus may include two tables: flow hash table 10 and a large-data flow (elephant) table 11. Processing logic 12 may be provided, which may be coupled to both flow hash table 10 and large-data flow table 11. Processing logic 12, which may be implemented in hardware, software, firmware, or combinations thereof, may perform various operations discussed below.

Reference is now made to FIG. 2 showing an example system. Reference can also be made to FIG. 3 which is a flow chart showing an example embodiment of a method for identifying large-data ("elephant") flows in a network. With reference to FIG. 2, a packet 210 arrives at a network device and relevant flow data is computed for the packet. To define a flow, a flow key is determined from a select number of fields in the header of the packet. In this example, five fields are selected: source IP address, destination IP address, source port, destination port and IP protocol; the resulting flow key comprises 300 bits. To avoid having to store and process such a large (300 bit) flow key value for every flow, a hash of the flow key is computed, generating a hashed flow signature, which is stored in a hash table.

In the example of FIG. 2, two hash functions are used. A first function "$H_0$" 212 applied to the flow key provides an index value that identifies a row number 214, which can be an 8-entry (per row) flow hash table 10. In one example, the hashing function $h_0$ randomly identifies a row in the flow hash table. A second hash function "$H_1$" 216 is applied to the flow key to produce a hashed flow signature 218. The hashed flow signature contains a lesser number of bits than the flow key, here for example 26 bits, compared to the larger 300 bit flow key. The term "hashed flow signature" as used herein generally refers to a computed flow signature that is generated by implementing a hash function on a flow key to reduce the number of bits for storage in a flow hash table. The hashed flow signature is used in the flow hash table to track and locate flows having matching flow signatures. As an example, the hashed flow signature can comprise 26 bits, while the flow key comprises 300 bits.

A byte count 219 for the incoming packet 210 is also obtained and added to a total byte count for the relevant flow in the flow hash table 10 as shown by dashed-line arrow 225.

In accordance with the example embodiment, each entry 230 in the flow hash table 10 has a valid bit 232, a flow signature 234, a total byte count 236 and a tracked bit 238. In the example embodiment the byte count includes the total byte count for the packet, including both header and payload number of bytes. However, in some embodiments the byte count can include the byte count for just the payload alone. The valid bit 232 notifies processing logic whether it is a valid entry or not. The flow signature 234 comprises the hashed flow signature produced by the hashing function $h_1$ and is compared to other flow signatures in the hash table as they are computed to determine whether they match, as described in greater detail with reference to FIG. 3. The byte count 236 is tracked, incremented as appropriate, and continuously tracked so that the relevant entry (data flow) can be moved to a large-data flow (elephant) table when the total byte count for a flow exceeds a predetermined threshold value. The tracked bit 238 is used once an entry has been moved to the large-data flow table to indicate that the entry is being tracked in the large-data flow table. Once the tracked bit 238 is set, the processing logic can determine that this entry has been identified as a large-data "elephant" flow and has been moved to the large-data flow table. The byte count value 236 is then replaced with a pointer to the appropriate entry in the large-data flow table 11 where the flow is now located (for tracking). As shown by the dashed-line arrow 270, the pointer to the row is placed in byte count field 236.

When the byte count 236 for a particular flow becomes greater than a threshold at 240, then the flow is considered to be an elephant and is moved to large-data flow table 11. The threshold 240 above which a flow is considered to be an elephant can be, for example, approximately 1 megabyte (MB) of data. However, this threshold can be variable, and those of ordinary skill in the art will recognize that other appropriate thresholds can be used, and the appropriate threshold can depend upon the particular application. Each entry in the large-data (elephant) flow table 11 includes a valid or "occupied" bit 252 (to let the system know that entry in the row is occupied), the 300 bit flow key 254, the total byte count 256 for the flow, the packet count 258, the bandwidth 260, the byte count for the current period 262, the first timestamp 264 and the last timestamp 266 of the flow. Each large-data flow entry in the large-data flow table includes the valid bit 252 that is initialized to be "empty" (i.e. the column in the row does not have a value associated with it) by initializing to a value of 0. When each new large-data flow entry is added to the large-data flow table, the first empty bit is located and a new large-data flow is inserted there and the bit is then given a value of 1, meaning the column is "filled". This entry is written in the flow hash table as a pointer. The tracked bit is set in the flow hash table so that when the large-data flow entry ages out, the "filled" value becomes an "empty" value. The large-data flows are tracked in the large-data flow table 11 until they are evicted. Refer to FIG. 4 for an example flow chart of adding large-data flows to the large-data flow table. Refer to FIG. 5 for an example flow chart of evicting large-data flows from the large-data flow table when appropriate.

Reference is now made to FIG. 3 showing an example embodiment of a flow chart for identifying large-data flows. When a packet enters the network device at 310, fields may be extracted from the packet header to construct a flow key at 320. More particularly, values may be extracted from header fields of a data packet received on a network device to derive a flow key. This may be performed, e.g., by processing logic 12. The flow key may be further processed, e.g., by masking various bits of the flow key. Such masking may permit flows to be aggregated into single flows. For example, if a flow key consists of {source_IP, destination_IP, source_port, destination_port, IP_protocol}, and if source_IP is masked, the new flow definition will be {destination_IP, source_port, destination_port, IP_protocol}. In this case, different keys having different source_IP addresses but the same values of the other fields may be considered to be a single flow, thus aggregating flows across source_IP.

After masking, the resulting masked flow key may be used for further processing. Two hash values may be computed on the flow at 330, of which one may be used as an index 335 to read a row in flow hash table 10, and the other may be used as a hashed flow signature 340. Each row in flow hash table 10 may be N-way set-associative. In a non-limiting example, N may be 8; in this example, a row of flow hash table 10 may thus have 8 entries. Each entry of flow hash table 10 may include a flow signature, a flow byte count, a valid flag, and a "tracked" flag.

At 342, the row indexed by the computed index 335 is read. The row, for example, can have 8 entries, each in its own column in the row.

At 345, the hashed flow signature may be compared with each of the flow signatures of the (e.g., 8 in the example above) entries in a row of flow hash table 10. At 347 it is determined if the compared values match. If one of the flow signatures in the row of the flow hash table 10 matches the newly hashed flow signature, the corresponding entry may be considered to be a "hit" at 348. Then at 350, the incoming packet length of the flow under consideration may be added to the byte count of the matching entry in the row of flow hash table 10, and at 352 this entry may be marked as the "Most Recently Used" (MRU) entry for that row. The entire corresponding row of flow hash table 10 may then be written back to flow hash table 10 at the same index. (With reference to FIG. 2, the entire row of the flow hash table 10 may then be written back to flow hash table 10 at the same index).

If none of the signatures in the row of flow hash table 10 matches the hashed flow signature, then at 360 this may be deemed a "miss." If this occurs, it is determined if there is a row without 8 entries (i.e. having an empty slot) at 362. If an empty entry in the row (e.g., among the 8 entries of the row of the example) is identified, the hashed flow signature may be written there at 364. This entry may be marked as the MRU at 366.

If none of the signatures match and there is no empty slot in the row, at 368 one of the existing (8) entries may then need to be "evicted," so the new flow may be entered in the row. The "Least Recently Used" (LRU) entry may be chosen for eviction, and the new flow inserted may be inserted into its slot and may be marked MRU at 366.

In order to maintain the LRU to MRU order in a row, the entries of the row may be reordered each time an entry is matched (or newly-entered). For example, let 0 be the left-most entry of the row, and using the example of 8 entries, let 7 be the right-most entry in the row. It may be desirable to arrange the entries from LRU in entry 0 to MRU in entry 7. Suppose, for example, that a new hashed flow signature matches one of the entries, say, the ith entry. Entries i+1 to 7 may then be moved left by one entry (which, in effect, reduces the "age" of each of the shifted entries by one), and the ith entry may be moved to the $7^{th}$ position, as it is the MRU (and the MRU should be placed in the $7^{th}$ position).

Reference is now made to FIG. 4 showing an example embodiment of a flow chart for adding large-data flows into a large-data flow "elephant" table. If a hit occurs for a flow at 410, this means that the hashed flow signature matches another flow signature in the flow hash table, and the byte count of the flow in flow hash table 10 may be incremented at 420, as discussed above. If the byte count of a flow exceeds a predefined threshold value at 430, the corresponding flow may be declared an elephant at 440 and may then be tracked in large-data flow table 11. To insert the flow into large-data flow table 11, an empty slot may be located in large-data flow table 11 at 452, and the complete flow key corresponding to the flow may be written into that slot at 454. At 456, a pointer to the flow in the large-data flow table is written into the byte count field for the flow entry in the flow hash table 11 after clearing out the byte count value. The "tracked" flag, mentioned above, may also be set at 458, to indicate that the flow is being tracked in the large-data flow table and, accordingly, to indicate that the byte count of the flow in flow hash table 10 should be interpreted as a pointer to the flow in large-data flow table 11. That is, the byte count in flow hash table 10 need no longer be maintained or updated for a "tracked" flow because more-detailed information may be now found in large-data flow table 11, containing the detailed flow.

In large-data flow table 11, an entry corresponding to a flow may include detailed flow information such as the four values shown in FIG. 2, and may include one or more of the following:

(a) Flow key, which includes the 300 bits of data to identify the flow.

(b) Packet count (pkt_count), which may reflect how many packets have been seen on the flow since tracking began.

(c) Byte count (byte_count), which may reflect how many bytes have been seen on the flow since tracking began.

(d) Start time-stamp (T_start), which may be a time-stamp of the first packet detected on the flow since tracking began.

(e) Last packet seen time-stamp (T_last), which may be a time-stamp of the latest packet detected on the flow since tracking began.

(f) Forwarding information, which may reflect to which port the packets of the flow should be sent. This may help to avoid or reduce forwarding lookups and may reduce latency. This may also assist in load-balancing of large-data (elephant) flows so that the multiple elephants do not attempt to go out of the same network device port.

(g) Sticky bit, which may indicate that the flow entry should never be aged out (i.e., an indicator that the flow should always be tracked).

(h) Bytes seen in a current period (B): Every T nanoseconds, large-data flow table 11 may be examined for the numbers of bytes accumulated to that time. The byte count in a period T may be used as a bandwidth for period T. This may be used to update bandwidth measurements and may be cleared for a subsequent period.

(i) Bandwidth (Bw), which may be a running average of the values of B. For example, Bw may be determined by means of the following equation:

$$BW_{next} = f * BW_{present} + (1-f) * B,$$

where f is a predefined weighting value between 0 and 1.

Reference is made to FIG. 5 showing an example embodiment of a flow chart for evicting large-data (elephant) flows from the large-data flow table. At 510, flow bandwidth may be compared with a predefined threshold value that may be used to set a minimum bandwidth for continued tracking. If the bandwidth falls below the threshold at 515, then at 520 the flow may be evicted from large-data flow table 11 as no longer being an elephant. A bitmap of valid bits for each elephant in large-data flow table 11 may be maintained, where each bit may indicate whether the elephant entry is occupied by a valid flow (see bit 252 of FIG. 2 for example). If an entry is evicted, the valid bit may be set to 0. When an entry is inserted into large-data flow table 11, the bitmap may be priority encoded, which may permit the determination of the first unoccupied entry in which to insert the new flow. Note that eviction from large-data flow table 11 does not invalidate the corresponding entry in flow hash table 10.

Thus, all flows may enter the flow hash table 10. If a flow does not keep sending packets (and, thus the bandwidth falls below the threshold bandwidth for continued tracking), it may quickly become the LRU and become eligible for eviction. An elephant flow results from sending packets quickly and generating hits in flow hash table 10. Every time the flow gets a hit, its status may be refreshed to MRU, so it may not be evicted easily.

Various sub-cases may arise. It may be possible that two different flows alias to a common location in flow hash table 10 and thus have the same hashed flow signature. If neither is being tracked, then the byte count associated with the hashed flow signature may account for bytes from both flows. If one of the two aliasing flows is being tracked, then the second flow may then mismatch with the flow key in large-data flow table 11, and consequently, this second flow may not be accounted for. If one of the two aliasing flows is being tracked, and if the corresponding large-data flow table entry says that the flow is not present (e.g., because it aged out), then the empty entry may be made available for either of the two aliasing flows. As a result, it is possible that a mouse may be tracked; however, this is likely to be short-lived, as the aging process should soon result in eviction of the mouse.

In some embodiments, an entry may be admitted to large-data flow table 11 on certain conditions. For instance, this condition may be "if packet dropped." In this case, the packets that are dropped may be tracked, and this may assist in identifying affected flows and diagnosing any associated problem.

Also, this may permit the admission of an entry in large-data flow table 11 only if it matches a specific ternary content-addressable memory (TCAM) filter, which may assist in narrowing the tracking focus to certain flows.

Figure 6:
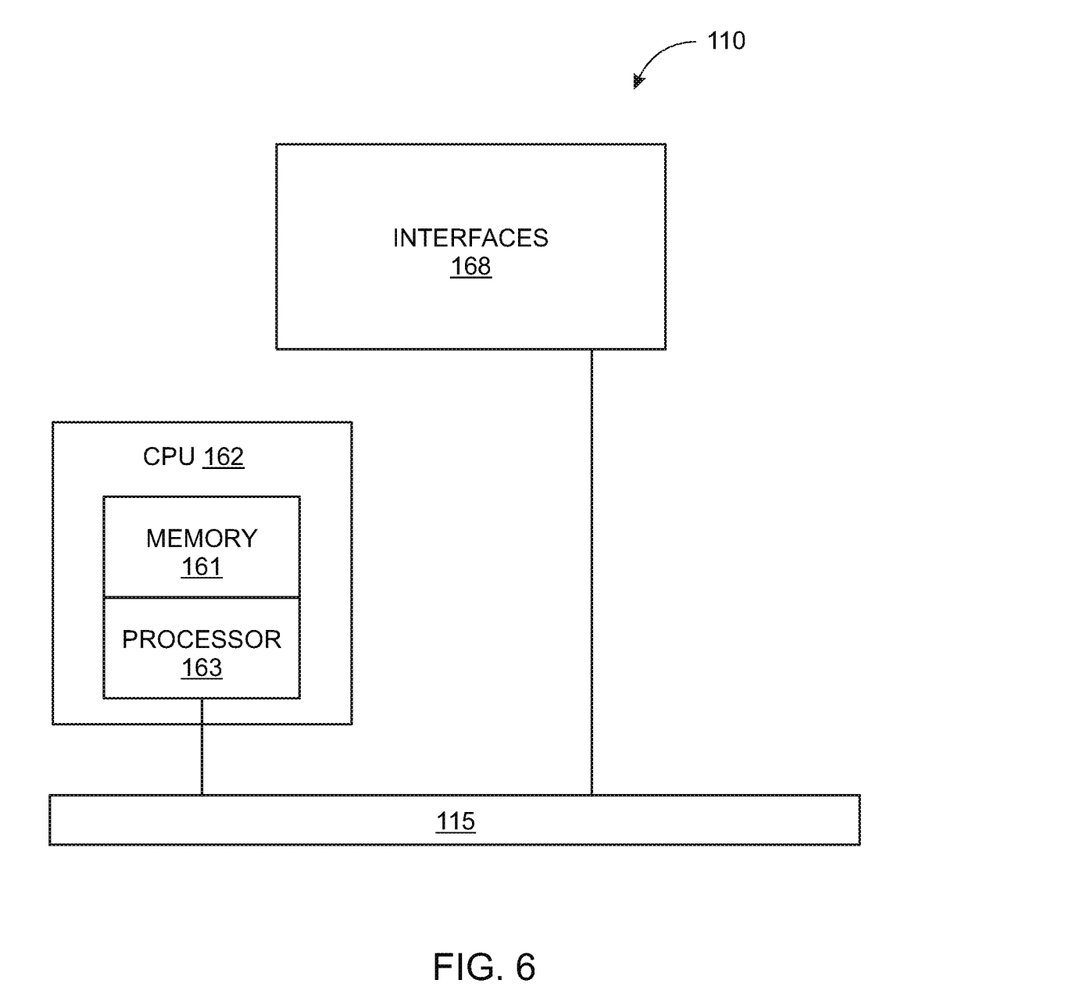
FIG. 6 illustrates an example embodiment of a network device in which various aspects of the present disclosure may be implemented.

FIG. 6 illustrates an example of a network device 110 in which various aspects of the present technology may be utilized. Network device 110 may include a master central processing unit (CPU) 162, interfaces 168, and a bus 115 (e.g., a PCI bus). When acting under the control of appropriate software or firmware, the CPU 162 may control and/or implement various functions described above, e.g., storage, monitoring, comparing, etc. It may accomplish such functions under the control of software including an operating system and any appropriate applications software. CPU 162 may include one or more processors 163, such as a processor from the Motorola family of microprocessors or the MIPS family of microprocessors. In an alternative embodiment, processor 163 may be specially-designed hardware for controlling the operations of router 110. In a specific embodiment, a memory 161 (such as non-volatile RAM and/or ROM) may also form part of CPU 162. However, there are many different ways in which memory could be coupled to the system.

The interfaces 168 may be provided as interface cards (sometimes referred to as "line cards"). Generally, they control the sending and receiving of data packets over the network and sometimes support other peripherals used with the router 110. Among the interfaces that may be provided are Ethernet interfaces, frame relay interfaces, cable interfaces, DSL interfaces, token ring interfaces, and the like. In addition, various very high-speed interfaces may be provided, such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 162 to efficiently perform routing computations, network diagnostics, security functions, etc.

Although the system shown in FIG. 6 is one specific network device in which the present technology may be implemented, it is by no means the only network device architecture on which the present technology can be implemented. For example, an architecture having a single processor that handles communications as well as routing computations, etc., may be used. Further, other types of interfaces and media could also be used with the router.

Regardless of the network device's configuration, it may employ one or more memories or memory modules (including memory 161) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

Figure 7:
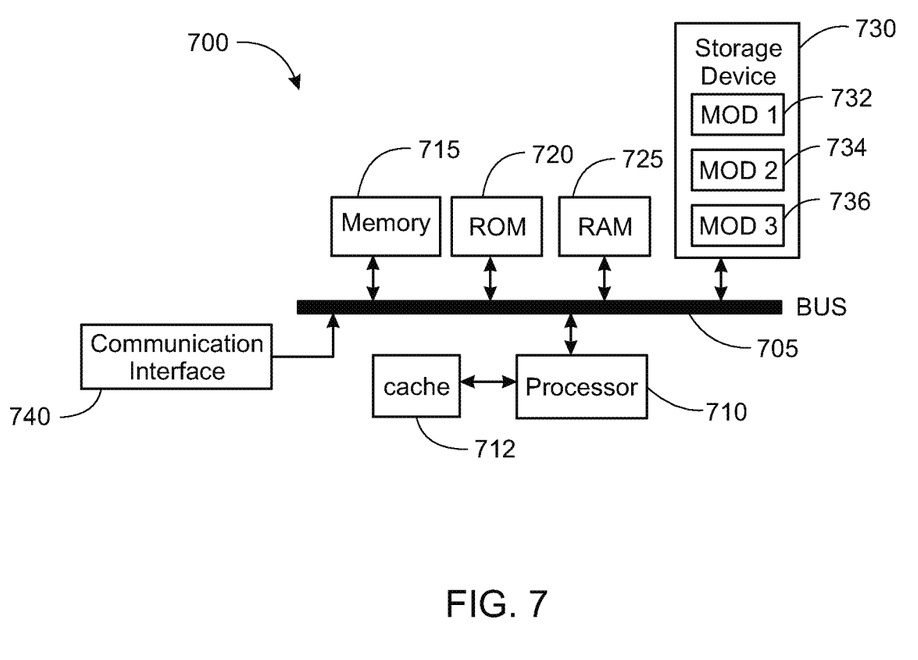
FIG. 7 illustrates an example of a system embodiment.

FIG. 7 illustrates exemplary possible system embodiments, such as a system making up network device 110. The more appropriate embodiment will be apparent to those of ordinary skill in the art when practicing the present technology. Persons of ordinary skill in the art will also readily appreciate that other system embodiments are possible.

FIG. 7 illustrates a conventional system bus computing system architecture 700 wherein the components of the system are in electrical communication with each other using a bus 705. Exemplary system 700 includes a processing unit (CPU or processor) 710 and a system bus 705 that couples various system components including the system memory 715, such as read only memory (ROM) 720 and random access memory (RAM) 725, to the processor 710. The system 700 can include a cache of high-speed memory connected directly with, in close proximity to, or integrated as part of the processor 710. The system 700 can copy data from the memory 715 and/or the storage device 730 to the cache 712 for quick access by the processor 710. In this way, the cache can provide a performance boost that avoids processor 710 delays while waiting for data. These and other modules can control or be configured to control the processor 710 to perform various actions. Other system memory 715 may be available for use as well. The memory 715 can include multiple different types of memory with different performance characteristics. The processor 710 can include any general purpose processor and a hardware module or software module, such as module 1 732, module 2 734, and module 3 736 stored in storage device 730, configured to control the processor 710 as well as a special-purpose processor where software instructions are incorporated into the actual processor design. The processor 710 may essentially be a completely self-contained computing system, containing multiple cores or processors, a bus, memory controller, cache, etc. A multi-core processor may be symmetric or asymmetric.

The communications interface 740 can generally govern and manage the user input and system output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof.

The storage device 730 can include software modules 732, 734, 736 for controlling the processor 710. Other hardware or software modules are contemplated. The storage device 730 can be connected to the system bus 705. In one aspect, a hardware module that performs a particular function can include the software component stored in a computer-readable medium in connection with the necessary hardware components, such as the processor 710, bus 705, display 735, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

We claim:

1. A method of tracking data flows, comprising:
   computing a hashed flow signature on values extracted from a data packet received on a network device, the hashed flow signature being used to locate a position for the hashed flow signature in a flow hash table;
   adding a flow key of a respective entry in the flow hash table to a large-data flow table when a byte count for an entry in the flow hash table exceeds a predetermined byte count threshold, wherein the entry in the flow hash table includes the byte count for the respective flow; and
   replacing the byte count in the flow hash table for the entry added to the large-data flow table with a pointer to the entry in the large-data flow table.

2. The method of claim 1 further comprising:
   reading a row in the flow hash table indexed by the hashed index value; and
   comparing the hashed flow signature with each signature in the row read from the flow hash table to determine if the hashed flow signature matches at least one existing flow signature in a column of the row to locate the hashed flow signature in the flow hash table.

3. The method of claim 2 wherein the comparing the hashed flow signature with
   each signature in the row read from the hash table further comprises:
   when the hashed flow signature matches the at least one existing flow signature in a column of the row of the flow hash table, locating the column in the flow hash table and adding a length of the packet to a byte counter in the flow hash table.

4. The method of claim 2 wherein the comparing the hashed flow signature with each signature in the row read from the hash table further comprises:
   when the hashed flow signature does not match the at least one existing flow signature in the flow hash table, entering the hashed flow signature into a column in the row by:
   locating an empty column in the row and inserting the hashed flow in the empty column.

5. The method of claim 2 wherein the comparing the hashed flow signature with each signature in the row read from the hash table further comprises:
   when the hashed flow signature does not match the at least one existing flow signature in the flow hash table, entering the hashed flow signature into a column in the row by evicting an entry when there is not an empty column in the row, and inserting the hashed flow signature in the evicted column.

6. The method of claim 1 further comprising tracking a bandwidth of each flow entry in the large-data flow table based on the byte count, and aging out entries from the large-data flow table.

7. A non-transitory computer readable medium containing program instructions for causing a computer to perform operations, comprising:
- computing a hashed flow signature on values extracted from a data packet received on a network device, the hashed flow signature being used to locate a position for the hashed flow signature in a flow hash table;
- adding a flow key of a respective entry in the flow hash table to a large-data flow table when a byte count for an entry in the flow hash table exceeds a predetermined byte count threshold, wherein the entry in the flow hash table includes the byte count for the respective flow; and
- replacing the byte count in the flow hash table for the entry added to the large-data flow table with a pointer to the entry in the large-data flow table.

8. The method of claim 7 the operations further comprising:
- reading a row in the flow hash table indexed by the hashed index value; and
- comparing the hashed flow signature with each signature in the row read from the flow hash table to determine if the hashed flow signature matches at least one existing flow signature in a column of the row to locate the hashed flow signature in the flow hash table.

9. The media of claim 8 wherein the comparing the hashed flow signature with each signature in the row read from the hash table further comprises:
- when the hashed flow signature matches the at least one existing flow signature in a column of the row of the flow hash table, locating the column in the flow hash table and adding a length of the packet to a byte counter in the flow hash table.

10. The media of claim 8 wherein the comparing the hashed flow signature with each signature in the row read from the hash table further comprises:
- when the hashed flow signature does not match the at least one existing flow signature in the flow hash table, entering the hashed flow signature into a column in the row by:
- locating an empty column in the row and inserting the hashed flow in the empty column.

11. The media of claim 7 wherein the comparing the hashed flow signature with each signature in the row read from the hash table further comprises:
- when the hashed flow signature does not match the at least one existing flow signature in the flow hash table, entering the hashed flow signature into a column in the row by evicting an entry when there is not an empty column in the row, and inserting the hashed flow signature in the evicted column.

12. The media of claim 7, the operations further comprising tracking a bandwidth of each flow entry in the large-data flow table based on the byte count, and aging out entries from the large-data flow table.

13. A system of tracking data flows, comprising:
a memory;
a processor, the processor being configured to perform operations comprising:
- computing a hashed flow signature on values extracted from a data packet received on a network device, the hashed flow signature being used to locate a position for the hashed flow signature in a flow hash table;
- adding a flow key of a respective entry in the flow hash table to a large-data flow table when a byte count for an entry in the flow hash table exceeds a predetermined byte count threshold, wherein the entry in the flow hash table includes the byte count for the respective flow; and
- replacing the byte count in the flow hash table for the entry added to the large-data flow table with a pointer to the entry in the large-data flow table.

14. The system of claim 13 the operations further comprising:
- reading a row in the flow hash table indexed by the hashed index value; and
- comparing the hashed flow signature with each signature in the row read from the flow hash table to determine if the hashed flow signature matches at least one existing flow signature in a column of the row to locate the hashed flow signature in the flow hash table.

15. The system of claim 14 wherein the comparing the hashed flow signature with each signature in the row read from the hash table further comprises:
- when the hashed flow signature matches the at least one existing flow signature in a column of the row of the flow hash table, locating the column in the flow hash table and adding a length of the packet to a byte counter in the flow hash table.

16. The system of claim 14 wherein the comparing the hashed flow signature with each signature in the row read from the hash table further comprises:
- when the hashed flow signature does not match the at least one existing flow signature in the flow hash table, entering the hashed flow signature into a column in the row by:
- locating an empty column in the row and inserting the hashed flow in the empty column.

17. The system of claim 14 wherein the comparing the hashed flow signature with each signature in the row read from the hash table further comprises:
- when the hashed flow signature does not match the at least one existing flow signature in the flow hash table, entering the hashed flow signature into a column in the row by evicting an entry when there is not an empty column in the row, and inserting the hashed flow signature in the evicted column.

* * * * *